United States Patent
Jung et al.

(10) Patent No.: US 12,211,837 B1
(45) Date of Patent: Jan. 28, 2025

(54) SEMICONDUCTOR DEVICE INCLUDING GATE CONTACT STRUCTURE FORMED FROM GATE STRUCTURE

(71) Applicant: SAMSUNG ELECTRONICS CO., LTD., Suwon-si (KR)

(72) Inventors: Myunghoon Jung, Clifton Park, NY (US); Jaehong Lee, Latham, NY (US); Seungchan Yun, Waterford, NY (US); Kang-ill Seo, Springfield, VA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/615,573

(22) Filed: Mar. 25, 2024

Related U.S. Application Data

(60) Provisional application No. 63/542,671, filed on Oct. 5, 2023.

(51) Int. Cl.
| | |
|---|---|
| *H01L 21/00* | (2006.01) |
| *H01L 21/8234* | (2006.01) |
| *H01L 27/06* | (2006.01) |
| *H01L 27/088* | (2006.01) |
| *H01L 29/06* | (2006.01) |
| *H01L 29/423* | (2006.01) |
| *H01L 29/66* | (2006.01) |
| *H01L 29/775* | (2006.01) |
| *H01L 29/786* | (2006.01) |

(52) U.S. Cl.
CPC .. *H01L 27/0688* (2013.01); *H01L 21/823437* (2013.01); *H01L 27/088* (2013.01); *H01L 29/0665* (2013.01); *H01L 29/42392* (2013.01); *H01L 29/66439* (2013.01); *H01L 29/66545* (2013.01); *H01L 29/775* (2013.01); *H01L 29/78696* (2013.01)

(58) Field of Classification Search
CPC ......... H01L 27/0688; H01L 21/823437; H01L 27/088
See application file for complete search history.

(56) References Cited

U.S. PATENT DOCUMENTS

| | | | |
|---|---|---|---|
| 7,459,383 B2 | 12/2008 | Lai | |
| 8,268,690 B2 * | 9/2012 | Lee | H10B 12/053 438/286 |
| 9,356,149 B2 | 5/2016 | Kamineni et al. | |
| 10,090,410 B1 | 10/2018 | Chi et al. | |
| 10,115,797 B2 * | 10/2018 | Song | H01L 29/785 |
| 10,164,112 B2 * | 12/2018 | Chiang | H01L 29/66795 |
| 10,361,280 B2 | 7/2019 | Ching et al. | |
| 10,475,788 B2 * | 11/2019 | Chen | H01L 29/42376 |
| 10,535,747 B2 | 1/2020 | Liu et al. | |
| 11,217,683 B2 * | 1/2022 | Chang | H01L 29/6653 |

(Continued)

FOREIGN PATENT DOCUMENTS

| | | | | |
|---|---|---|---|---|
| CN | 114256232 A * | 3/2022 | | B82Y 10/00 |

*Primary Examiner* — Laura M Menz
(74) *Attorney, Agent, or Firm* — Sughrue Mion, PLLC

(57) ABSTRACT

Provided is a semiconductor device which may include: a channel structure; a gate structure on the channel structure; and a gate contact structure on the gate structure, the gate contact structure configured to receive a gate input signal, wherein the gate contact structure is a portion of the gate structure itself, and no connection surface, interface or boundary is formed between the gate contact structure and the gate structure.

8 Claims, 16 Drawing Sheets

(56) References Cited

U.S. PATENT DOCUMENTS

| | | | |
|---|---|---|---|
| 11,949,000 B2* | 4/2024 | Hsiao | H01L 29/0847 |
| 2020/0058764 A1 | 2/2020 | Miao et al. | |
| 2020/0286938 A1* | 9/2020 | Jin | H01L 27/14605 |
| 2020/0357920 A1* | 11/2020 | Song | H01L 29/66666 |
| 2021/0202732 A1* | 7/2021 | Chang | H01L 29/41791 |
| 2021/0257474 A1 | 8/2021 | Lee et al. | |
| 2022/0254929 A1* | 8/2022 | Lin | H01L 29/42392 |
| 2022/0328648 A1 | 10/2022 | Wong et al. | |
| 2022/0399349 A1* | 12/2022 | Okada | G11C 16/08 |
| 2023/0085628 A1* | 3/2023 | Xie | H01L 21/8221 |
| | | | 257/369 |
| 2023/0086084 A1* | 3/2023 | Yun | H01L 29/6656 |
| | | | 257/401 |
| 2023/0178553 A1* | 6/2023 | Xie | H01L 29/66742 |
| | | | 257/351 |
| 2023/0253451 A1 | 10/2023 | More | |
| 2023/0326926 A1* | 10/2023 | Kwon | H01L 27/092 |
| 2023/0335584 A1* | 10/2023 | Lin | H01L 21/7682 |
| 2023/0343824 A1* | 10/2023 | Yun | H01L 29/66439 |
| 2023/0343845 A1* | 10/2023 | Hong | H01L 21/8221 |
| 2023/0352529 A1* | 11/2023 | Jo | H01L 27/092 |
| 2024/0023326 A1* | 1/2024 | Hong | H01L 29/42376 |
| 2024/0145343 A1* | 5/2024 | Park | H01L 29/0673 |
| 2024/0162090 A1* | 5/2024 | Mazza | H01L 23/5226 |
| 2024/0274676 A1* | 8/2024 | Lee | H01L 29/7848 |
| 2024/0282670 A1* | 8/2024 | Yang | H01L 21/823481 |
| 2024/0304669 A1* | 9/2024 | Park | H01L 29/78696 |
| 2024/0313000 A1* | 9/2024 | Kim | H01L 27/124 |

* cited by examiner

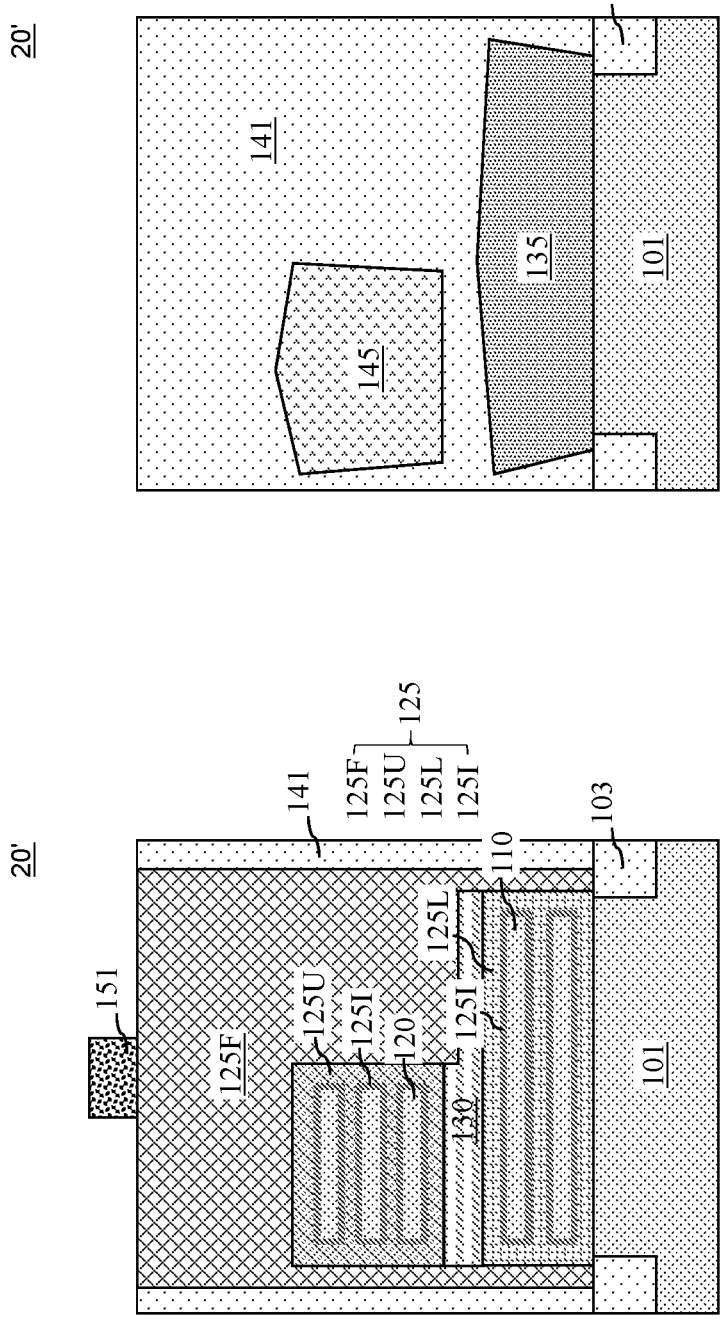

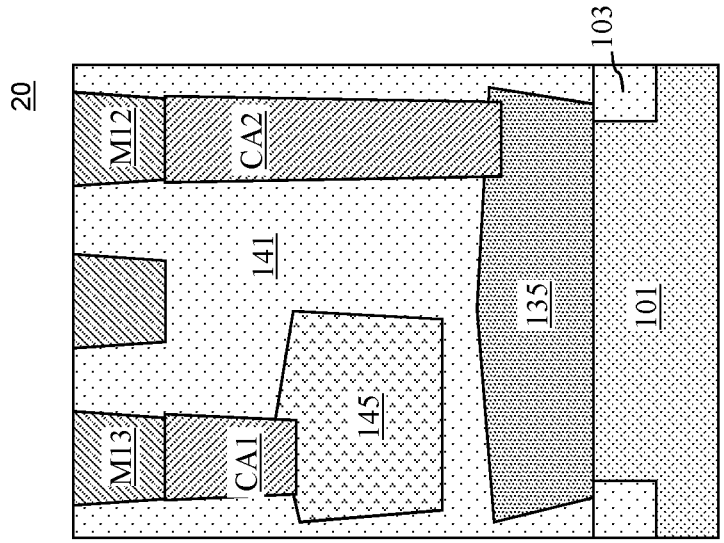
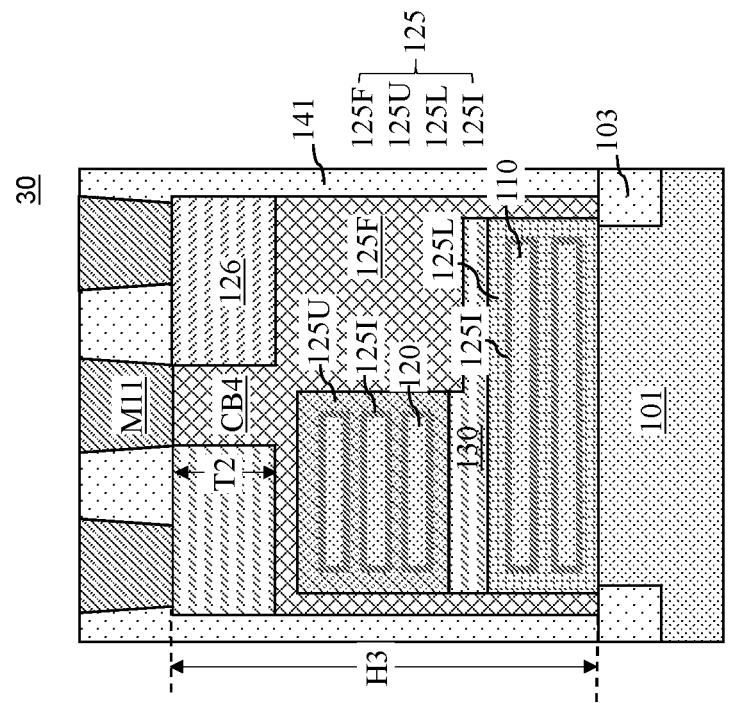
FIG. 13A
FIG. 13B

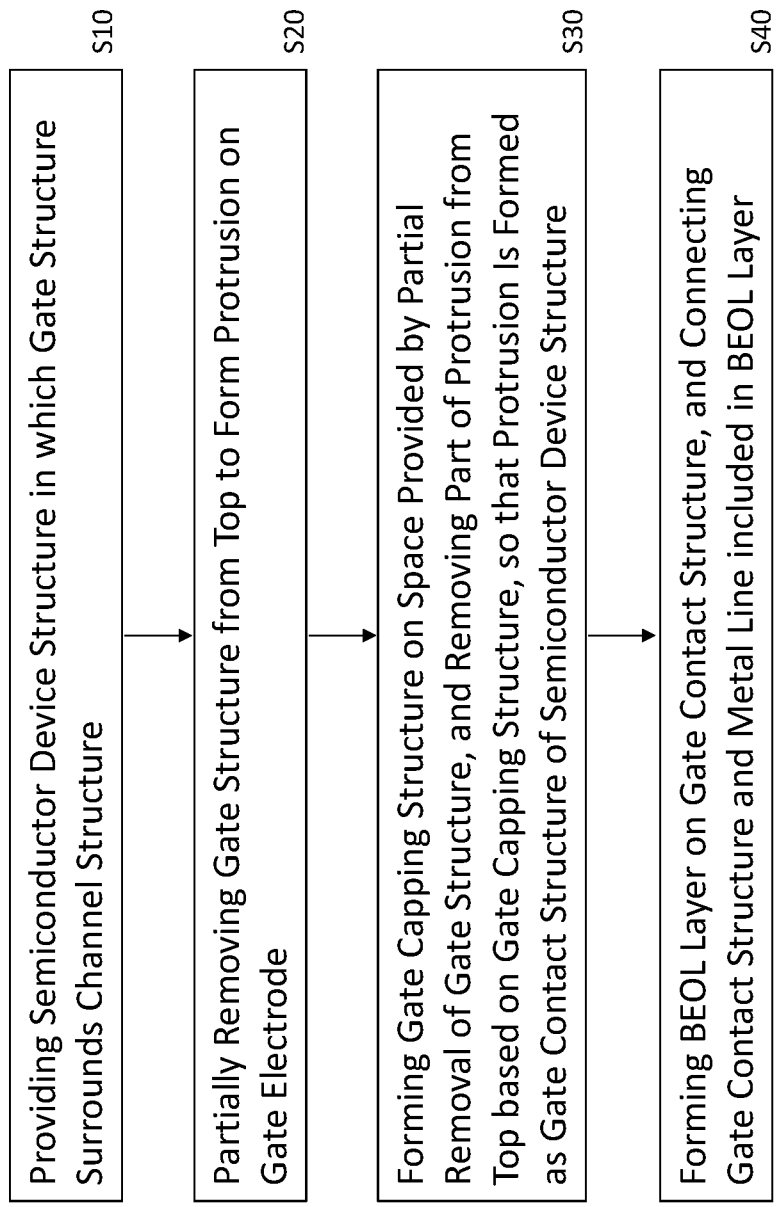

SEMICONDUCTOR DEVICE INCLUDING GATE CONTACT STRUCTURE FORMED FROM GATE STRUCTURE

CROSS-REFERENCE TO RELATED APPLICATION

This application is based on and claims priority from U.S. Provisional Application No. 63/542,671 filed on Oct. 5, 2023 in the U.S. Patent and Trademark Office, the disclosure of which is incorporated herein in its entirety by reference.

BACKGROUND

Apparatuses and methods consistent with the disclosure relate to a three dimension stacked (3D-stacked) semiconductor device, also referred to as a multi-stack semiconductor device, in which a gate structure is lowered in height and a portion of the gate structure is formed as a gate contact structure.

A 3D-stacked semiconductor device has been introduced in response to increased demand for an integrated circuit having a high device density and performance. The 3D-stacked semiconductor device may include a $1^{st}$ transistor at a $1^{st}$ level and a $2^{nd}$ transistor at a $2^{nd}$ level above the $1^{st}$ level, where each of the two transistors may be a fin field-effect transistor (FinFET), a nanosheet transistor, a forksheet transistor, or any other type of transistor.

The FinFET has one or more horizontally arranged vertical fin structures as a channel structure of which at least three surfaces are surrounded by a gate structure, and the nanosheet transistor is characterized by one or more nanosheet channel layers vertically stacked on a substrate as a channel structure and a gate structure surrounding all four surfaces of each of the nanosheet channel layers. The nanosheet transistor is referred to as gate-all-around (GAA) transistor, or as a multi-bridge channel field-effect transistor (MBCFET). The forksheet transistor is a combination of two nanosheet transistors with an insulation backbone structure therebetween. Nanosheet channel layers of each nanosheet transistor are formed at each side of the insulation backbone structure and pass through a gate structure in parallel with the backbone structure.

With device density increases for the 3D-stacked semiconductor device, an aspect ratio allowed for the formation of a gate structure and a gate contact structure in the 3D-stacked semiconductor device increases. Further, the reduced contact-poly-pitch (CPP) and cell height along with the high aspect ratio present greater challenges in improving a yield of the 3D-stacked semiconductor device because of a short-circuit risk and capacitance increase between a gate contact structure and other circuit elements such as a source/drain contact structure and capacitance therebetween.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

According to an aspect of the disclosure, there is provided a semiconductor device which may include: a channel structure; a gate structure on the channel structure; and a gate contact structure on the gate structure, the gate contact structure configured to receive a gate input signal, wherein the gate contact structure is a portion of the gate structure itself, and no connection surface, interface or boundary is formed between the gate contact structure and the gate structure.

According to an aspect of the disclosure, the gate structure is formed of a gate dielectric layer, a work-function metal layer, and a gate electrode, and the gate contact structure is a portion of the gate electrode.

According to an aspect of the disclosure, there is provided a semiconductor device which may include: a channel structure; a gate structure on the channel structure; and a gate contact structure on the gate structure, the gate contact structure configured to receive a gate input signal, wherein the gate contact structure is a portion of the gate structure itself, and the gate contact structure includes a protrusion or pillar on a top surface of the gate structure.

According to an aspect of the disclosure, the gate structure includes a gate dielectric layer, a work-function metal layer, and a gate electrode, and the top surface on which the protrusion or pillar is formed is a surface of the gate electrode.

According to an aspect of the disclosure, there is provided a method of manufacturing a semiconductor device, which may include: forming a gate structure on a channel structure; patterning the gate structure except a portion such that the portion forms a protrusion on the patterned gate structure; and connecting the protrusion to a metal line, wherein the protrusion is a gate contact structure configured to receive a gate input signal for the semiconductor device, wherein the patterning the gate structure is performed by partially patterning the gate structure from top except the portion by a predetermined depth from top.

BRIEF DESCRIPTION OF DRAWINGS

Example embodiments of the disclosure will be more clearly understood from the following detailed description taken in conjunction with the accompanying drawings.

FIGS. 5A-5B to FIGS. 13A-13B illustrate semiconductor device structures after respective steps of manufacturing a 3D-stacked semiconductor device including a gate contact structure which is a portion of a gate structure itself, according to one or more embodiments.

FIGS. 5A and 5B illustrate a semiconductor device structure in which a hard mask pattern is formed on a gate structure.

FIGS. 13A and 13B illustrate a semiconductor device structure on which metal lines are formed to be connected to a gate protrusion and source/drain contact structures.

FIG. 14 illustrates a flowchart of manufacturing a semiconductor device including a gate contact structure which is a portion of a gate structure itself, according to one or more embodiments.

DETAILED DESCRIPTION

Figure 1A:
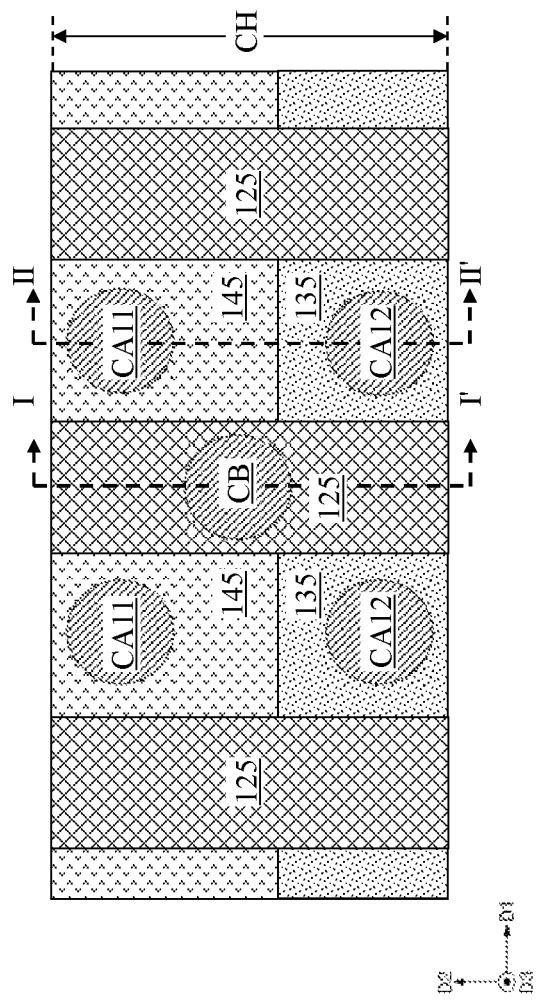
FIGS. 1A-1C illustrate a 3D-stacked semiconductor device in which a gate contact structure is formed on a gate structure, and source/drain contact structures are formed on source/drain regions at different levels, respectively, according to one or more embodiments.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, and isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, an element described as "below" or "beneath" another element would then be oriented "above" the other element. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," "$5^{th}$," "$6^{th}$," etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of semiconductor devices including a nanosheet transistor and materials forming the same may or may not be described in detail herein. For example, a certain isolation layer or structure of a semiconductor device and materials forming the same may be omitted herein when this layer or structure is not related to the novel features of the embodiments. Also, descriptions of materials forming well-known structural elements of a semiconductor device may be omitted herein when those materials are not relevant to the novel features of the embodiments. Herein, the term "isolation" pertains to electrical insulation or separation between structures, layers, components or regions in a corresponding device or structure.

Figure 1C:
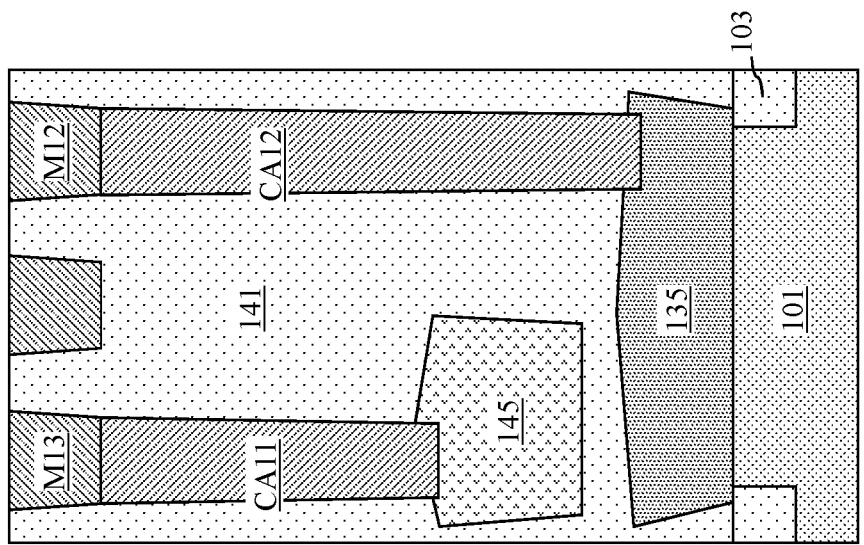
Figure 1B:
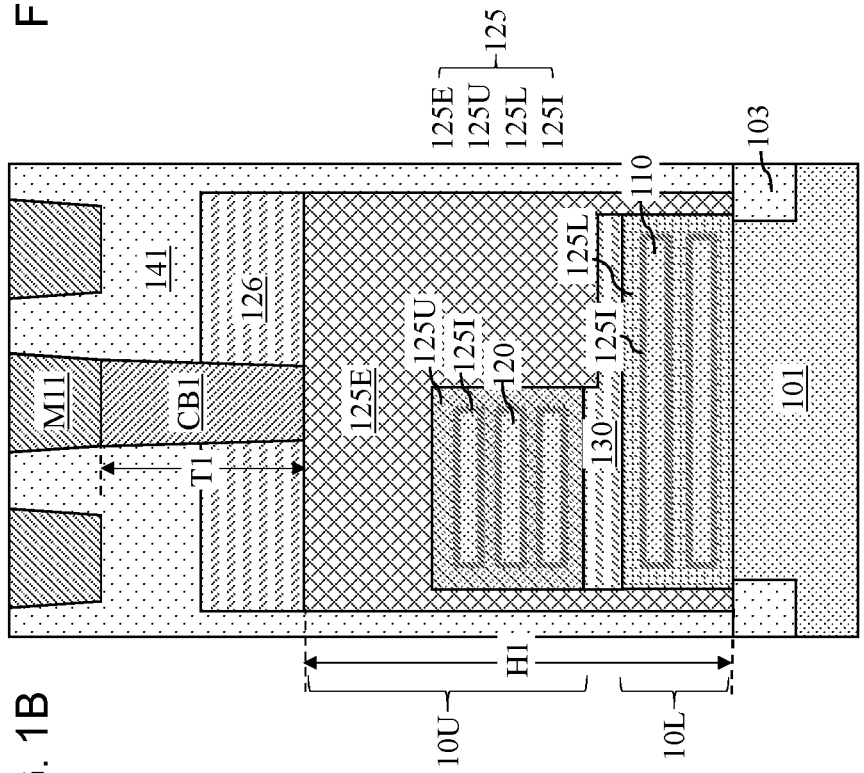

FIGS. 1A-1C illustrate a 3D-stacked semiconductor device in which a gate contact structure is formed on a gate structure, and source/drain contact structures are formed on source/drain regions at different levels, respectively, according to one or more embodiments.

FIGS. 1B and 1C are cross-section views of the 3D-stacked semiconductor device shown in FIG. 1A taken along lines I-I' and II-II', respectively. It is to be understood here that FIG. 1A is provided to show a positional relationship between gate structures, a gate contact structure, source/drain regions and source/drain contact structures, and thus, some structural elements such as isolation layers and a back-end-of-line (BEOL) structures such as metal lines shown in FIGS. 1B and 1C are not shown in FIG. 1A.

As shown in FIG. 1A, a D1 direction is a channel-length direction in which a current flows between two source/drain regions connected to each other through a channel structure, a D2 direction is a channel-width direction or a cell-height direction that intersects the D1 direction, and a D3 direction is a channel-thickness direction that intersects the D1 and D2 directions.

Referring to FIGS. 1A-1C, a 3D-stacked semiconductor device 10 may include a plurality of $1^{st}$ channel layers 110 and a plurality of $2^{nd}$ channel layers 120 thereabove. The $1^{st}$ channel layers 110 may be formed at a $1^{st}$ level on a substrate 101, and the $2^{nd}$ channel layers 120 may be formed at a $2^{nd}$ level above the $1^{st}$ level. A middle isolation structure 130 may be formed between the uppermost channel layer among the $1^{st}$ channel layers 110 and the lowermost channel layer among the $2^{nd}$ channel layers 120. These channel layer 110 and 120 may have been epitaxially grown from a substrate 101. The $1^{st}$ channel layers 110 may connect $1^{st}$ source/drain regions 135 to each other so that a current flows therebetween at a control of a gate structure 125 which surrounds the $1^{st}$ channel layers 110. Similarly, the $2^{nd}$ channel layers 120 may connect $2^{nd}$ source/drain regions 145 to each other so that a current flows therebetween at a control of the gate structure 125 which surrounds the $2^{nd}$ channel layers 120. The $1^{st}$ source/drain regions 135 may be epitaxially grown from the $1^{st}$ channel layers 110 and the $2^{nd}$ source/drain regions 145 may be epitaxially grown from the $2^{nd}$ channel layers 120.

Thus, in the 3D-stacked semiconductor device 10, the $1^{st}$ channel layers 110 along with the $1^{st}$ source/drain regions 135 and the gate structure 125 may form a $1^{st}$ transistor 10L, which is a nanosheet transistor, at the $1^{st}$ level. Further, the $2^{nd}$ channel layers 120 along with the $2^{nd}$ source/drain regions 145 and the gate structure 125 may form a $2^{nd}$ transistor 10U, which is also a nanosheet transistor, at the $2^{nd}$ level.

The substrate 101 may be a silicon (Si) substrate. Additionally or alternatively, it may include other materials such as silicon germanium (SiGe), silicon carbide (SiC), not being limited thereto. The $1^{st}$ channel layers 110 and the $2^{nd}$ channel layers 120 may each be formed of silicon (Si) or silicon germanium (SiGe). The $1^{st}$ source/drain regions 135 and the $2^{nd}$ source/drain regions 145 may also be formed of Si or SiGe. However, when the $1^{st}$ source/drain regions 135 are formed of Si and doped with n-type impurities such as phosphorus (P), arsenic (As), antimony (Sb), etc., the $1^{st}$ transistor 10L may be an n-type transistor. In contrast, when the $2^{nd}$ source/drain regions 145 are formed of SiGe and doped with impurities such as boron (B), gallium (Ga), indium (In), etc., the $2^{nd}$ transistor 10U may be a p-type transistor.

On an upper-left corner and an upper-right corner of the substrate 101 may be formed a shallow isolation trench (STI) structure 103, and an isolation structure 141 may be formed on the STI structure 103. The STI structure 103 and the isolation structure 141 may isolate the 3D-stacked semiconductor device 10 from another 3D-stacked semiconductor device or circuit element. The STI structure 103 and the isolation structure 141 may each be formed of silicon oxide (SiO, $SiO_2$, etc.). The middle isolation structure 130 may be formed of silicon nitride (e.g., SiN, SiBCN, SiCN, SiOCN, etc.).

The gate structure 125 may include a gate dielectric layer 125I, a $1^{st}$ work-function metal layer 125L, a $2^{nd}$ work-function metal layer 125U, and a gate electrode 125E. The gate structure 125 may have a height H1 in the D3 direction, and this height H1 may be a height of the gate electrode 125E. The gate dielectric layer 125I may include an interfacial layer and a high-k dielectric layer formed on the interfacial layer. The interfacial layer may be formed on each of the channel layers 110 and 120 to protect the channel layers 110 and 120 and facilitate growth of the high-k dielectric layer thereon, and the high-k dielectric layer may be formed on the interfacial layer to allow an increased gate capacitance without associated current leakage from the gate structure 125. For these purposes, the interfacial layer may include an oxide material such as silicon oxide (SiO or $SiO_2$) and/or silicon oxynitride (SiON), not being limited thereto, and the high-k dielectric layer may include a high-k material such as Hf, Al, Zr, La, Mg, Ba, Ti, Pb, and/or a combination thereof, not being limited thereto.

The $1^{st}$ work-function metal layer 125L may formed on the gate dielectric layer 125I surrounding the $1^{st}$ channel layers 110 to control a gate threshold voltage for the $1^{st}$ transistor 10L, and the $2^{nd}$ work-function metal layer 125U may formed on the gate dielectric layer 125I surrounding the $2^{nd}$ channel layers 120 to control a gate threshold voltage for the $2^{nd}$ transistor 10U. Each of the $1^{st}$ and $2^{nd}$ work-function metal layers 125L and 125U may be formed of a metal such as Ti, Ta, Al, W, TIN, WN, TiAl, TiAlN, TaN, TIC, TaC, TiAlC, TaCN, TaSiN, and/or a combination thereof, not being limited thereto. However, the $1^{st}$ work-function metal layer for the $1^{st}$ transistor 10L and the $2^{nd}$ work-function metal layer for the $2^{nd}$ transistor 10U may be formed of different materials when the two transistors are of different polarity types, i.e., n-type and p-type, respectively. When the $1^{st}$ transistor 10L is of n-type and the $2^{nd}$ transistor 10U is of p-type, the $1^{st}$ work-function metal layer may be formed of Al or TiC, and the $2^{nd}$ work-function metal layer 125U may be formed of TiN.

Although the $1^{st}$ and $2^{nd}$ transistors 10L and 10U have different $1^{st}$ and $2^{nd}$ work-function metal layers 125L and 125U, respectively, the two work-function metal layers 125L and 125U may be surrounded by the same gate electrode 125E to form the two transistors 10L and 10U as a CMOS device, e.g., an inverter circuit. The gate electrode 125E may be formed of Cu, W, Al, Ru, Mo, Co, and/or a combination thereof, not being limited thereto.

On the gate structure 125 may be formed a gate capping structure 126 to protect the gate structure 125. The gate capping structure 126 may be formed of silicon nitride (e.g., SiN, SiBCN, SiCN, SiOCN, etc.).

A gate contact structure CB1 having a height T1 may be formed on the gate structure 125 to be connected to a metal line M11 formed thereon through the gate capping structure 126. The gate structure 125 may receive a gate input signal from the metal line M11 through the gate contact structure CB1. Similarly, a $1^{st}$ source/drain contact structure CA11 may be formed on the $1^{st}$ source/drain region 135, and a $2^{nd}$ source/drain contact structure CA12 may be formed on the $2^{nd}$ source/drain region 145. The $1^{st}$ and $2^{nd}$ source/drain contact structures CA11 and CA12 may connect the $1^{st}$ and $2^{nd}$ source/drain regions 135 and 135 to one or more voltage sources or another circuit element for internal signal routing through metal lines M12 and M13, respectively. The gate contact structure CB1 and the source/drain contact structures CA11 and CA12 may be formed of the same or similar metal that forms the gate electrode 125E. However, as the gate contact structure CB1 and the gate electrode 125E are two different, separate structures formed at different steps, a connection surface (or interface) may be formed between the two structures. Further, a barrier metal layer may be formed at the connection surface (or interface) to enhance adhesion and reduce contact resistance between the two structures. The barrier metal layers may be formed of TiN, TaN, or so on.

FIGS. 1A-1C show that the $2^{nd}$ channel layers 120 are formed to have a smaller width in the D2 direction than the $1^{st}$ channel layers 110, and accordingly, the $2^{nd}$ source/drain regions 145 grown from the $2^{nd}$ channel layers 120 have a smaller width in the D2 direction than the $1^{st}$ source/drain regions 135 grown from the $1^{st}$ channel layers 110. This width differences are provided to form the $2^{nd}$ source/drain contact structure CA12 extended straight down from the metal line M12 can be formed on a top surface of the $1^{st}$ source/drain region 135. This is because, when the $2^{nd}$ source/drain region 145 has a greater or equal width than the $1^{st}$ source/drain region 135 therebelow, there is no space for the source/drain contact structure CA12 to be connected to the top surface of the $1^{st}$ source/drain region 135.

In the meantime, as the 3D-stacked semiconductor device 10 is configured to provide a high device density in a limited nanometer-scale area, a size of the gate structure 125 is minimized in the D2 direction to have a cell height CH (shown in FIG. 1A) in the D2 direction. Thus, the gate contact structure CB1 may be inevitably formed on the gate structure 125 within the cell height CH as shown in FIG. 1A. Further, the 3D-stacked semiconductor device provides two transistors 10L and 10U, which may each be a nanosheet transistor, at two different levels, the entire device structure may have a high aspect ratio as shown in FIGS. 1B and 1C. Accordingly, there is a high risk of etching/deposition misalignment between the gate contact structure CB1 and the gate structure 125, which may lead to a short circuit between the gate contact structure CB1 and other circuit elements including at least one of the source/drain contact structure CA11 and CA12.

The following embodiments provide a 3D-stacked semiconductor device which may address the above-described misalignment and short-circuit risk.

Figure 2B:
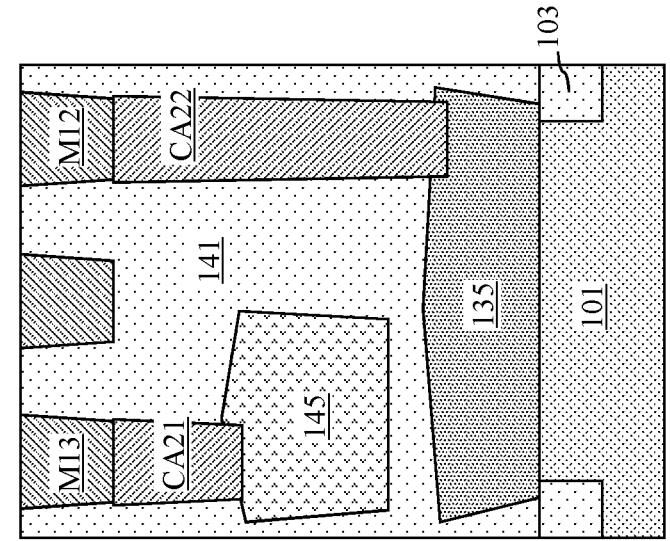
FIGS. 2A and 2B illustrate a 3D-stacked semiconductor device including a gate contact structure which is a portion of a gate structure itself, according to one or more embodiments.
Figure 2A:
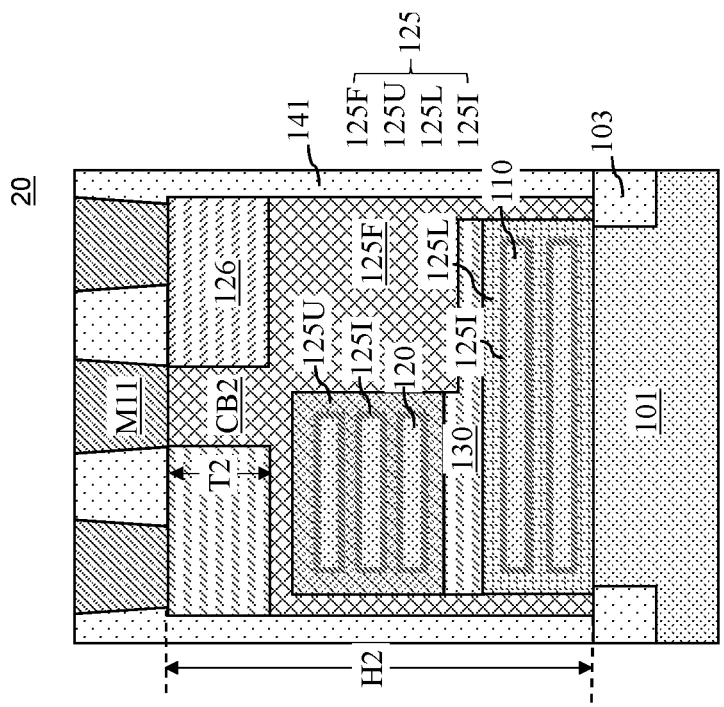

FIGS. 2A and 2B illustrate a 3D-stacked semiconductor device including a gate contact structure which is a portion of a gate structure itself, according to one or more embodiments. FIGS. 2A and 2B are cross-section views of the 3D-stacked semiconductor device corresponding to FIGS. 1B and 1C.

Referring to FIGS. 2A and 2B, a 3D-stacked semiconductor device 20 may include the same structural elements included in the 3D-stacked semiconductor device 10 of FIGS. 1A-1C except a gate electrode 125F, a gate contact structure CB2, and source/drain contact structures CA21 and CA22. Thus, while duplicate descriptions of the same structural elements are omitted herein, different aspects of the 3D-stacked semiconductor device 20 in view of the 3D-stacked semiconductor device 10 are described herebelow.

In the 3D-stacked semiconductor device 20, the gate contact structure CB2 is not a separate structure formed on a gate structure 125, and instead, may be a protrusion or pillar (herebelow "protrusion") of a gate electrode 125F protruded upward by a height T2 in the D3 direction. This gate protrusion may be a part of the gate structure 125 itself, that is, a portion of the gate electrode 125F itself, and thus, the gate protrusion and the gate electrode 125F may be a single continuum structure which does not have any connection surface, interface, barrier, or a barrier metal layer between the gate contact structure CB2 and the gate electrode 125F.

Due to this gate protrusion taking a protrusion, a top surface the gate electrode 125F cannot be flat, plain or substantially flat or plain. The protrusion of the gate electrode 125F may be connected to the metal line M11 as a gate contact structure and laterally surrounded by the gate capping structure 126.

As will be described later, the height T2 of the gate protrusion of the gate structure 125 may be smaller than the height T1 of the gate contact structure CB1 of the 3D-stacked semiconductor device 10. Further, the gate structure 125 of the 3D-stacked semiconductor device 20 may have a height H2 which is smaller than the height H1 of the gate structure 125 of the 3D-stacked semiconductor device 10. Thus, due to the height-shortened gate structure 125 including the gate contact structure CB2, an area gain may be achieved and a risk of misalignment between the gate contact structure CB2 and the metal line M11 may be reduced in a process of manufacturing the 3D-stacked semiconductor device 20.

Along with the reduction of the height of the gate structure 125, heights of the source/drain contact structures CA21 and CA22 in the 3D-stacked semiconductor device 20 may also be shortened in the D3 direction compared to those of the source/drain contact structure CA11 and CA12 in the 3D-stacked semiconductor device 10. Accordingly, a height of the isolation structure 141 in the 3D-stacked semiconductor device 20 may also be formed smaller in the D3 direction than that of the isolation structure 141 in the 3D-stacked semiconductor device 10.

The above-described structural characteristics of the 3D-stacked semiconductor device 20 may provide a device density as well as an area gain. In addition, due to the gate structure CB2, which is a portion of the gate structure 125 itself, the 3D-stacked semiconductor device 20 may dispense with a separate gate contact structure like the gate contact structure CB1 of the 3D-stacked semiconductor device 10 to make the process of manufacturing the 3D-stacked semiconductor device 20 simpler. Further, the height-shortened gate structure 125 and the source/drain contact structures CA21 and CA22 may enable the 3D-stacked semiconductor device 20 to have a smaller aspect ratio, which may reduce a risk of forming misaligned gate contact structure CB2 and source/drain contact structures CA21 and CA22, thereby also to reduce a short-circuit risk therebetween. Capacitance between the gate contact structure CB2 and the source/drain contact structures CA21 and CA22 may also be reduced due to their smaller sizes. Moreover, the gate contact structure CB2 and the gate electrode 125F may have no or minimal contact resistance therebetween because no connection surface, interface, barrier, or a barrier metal layer may be formed between the gate contact structure CB2 and the gate electrode 125F.

In the above embodiments, the gate protrusion of the gate structure 125, that is, the gate contact structure CB, is formed in a center portion of the gate structure 125 as shown in FIG. 2A. However, the disclosure is not limited to the above embodiment, and the gate protrusion may be formed at a different portion of the gate structure 125, according to one or more embodiments.

In the meantime, like the gate electrode 125E of the 3D-stacked semiconductor device 10 shown in FIGS. 1A-1C, the gate electrode 125F of the 3D-stacked semiconductor device 20 may also be a common gate electrode surrounding both the $1^{st}$ and the $2^{nd}$ work-function metal layers 125L and 125U. However, the disclosure is not limited thereto, and the $1^{st}$ and $2^{nd}$ work-function metal layers 125L and 125U may be surrounded by respective gate electrodes isolated from each other, in which case the gate contact structure CB2 may be formed as a protrusion of the gate electrode surrounding the $2^{nd}$ work-function metal layer 125U and may be configured to receive a gate input signal for the $2^{nd}$ transistor 10U. In this case, a separate gate contact structure may be formed on the gate electrode surrounding the $1^{st}$ work-function metal layer 125L to receive a gate input signal for the $1^{st}$ transistor 10L.

Figure 3B:
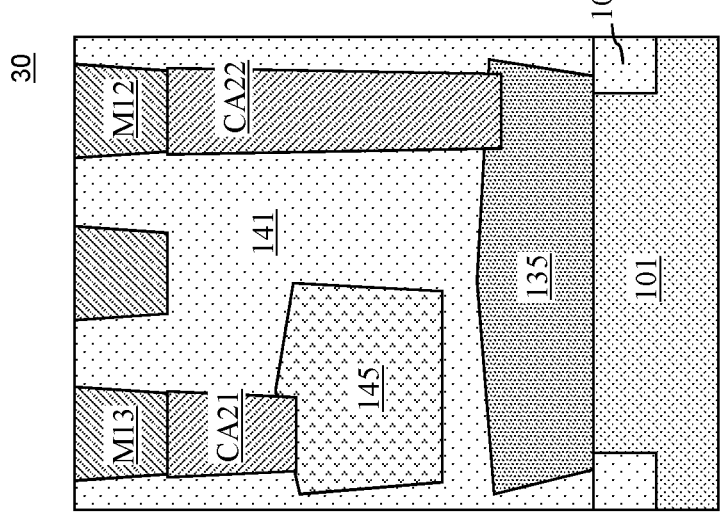
FIGS. 3A and 3B illustrate a 3D-stacked semiconductor device including a gate contact structure which is a portion of a gate structure itself, according to one or more other embodiments.
Figure 3A:
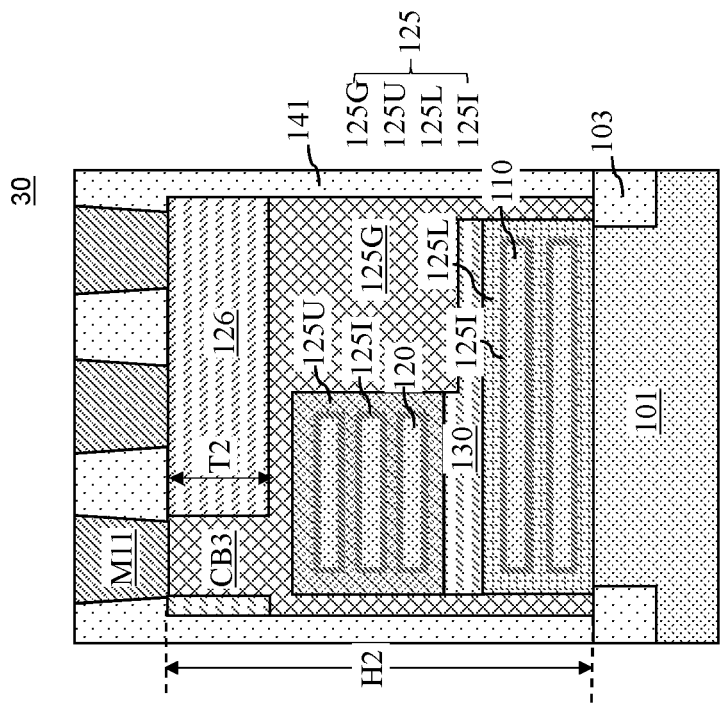

FIGS. 3A and 3B illustrate a 3D-stacked semiconductor device including a gate contact structure which is a portion of a gate structure itself, according to one or more other embodiments. FIGS. 3A and 3B are cross-section views corresponding to FIGS. 2A and 2B.

Referring to FIGS. 3A and 3B, a 3D-stacked semiconductor device 30 may have the same structural elements included in the 3D-stacked semiconductor device 20 of FIGS. 2A and 2B except that a gate electrode 125G has a protrusion at a different position. That is, in the 3D-stacked semiconductor device 30, a protrusion of the gate electrode 125G, which is a gate contact structure CB3, is formed not from a center portion but a left portion of the gate electrode 125G.

Still, however, the height-shortened gate structure 125 and source/drain contact structures CA21 and CA22 may contribute to increasing a device density and an area gain, reducing capacitance and resistance, reducing a risk of misalignment and short-circuit, and achieving a simple manufacturing process.

In the meantime, the gate protrusion may be formed such that the entire height of the gate structure is further reduced as described below.

Figure 4B:
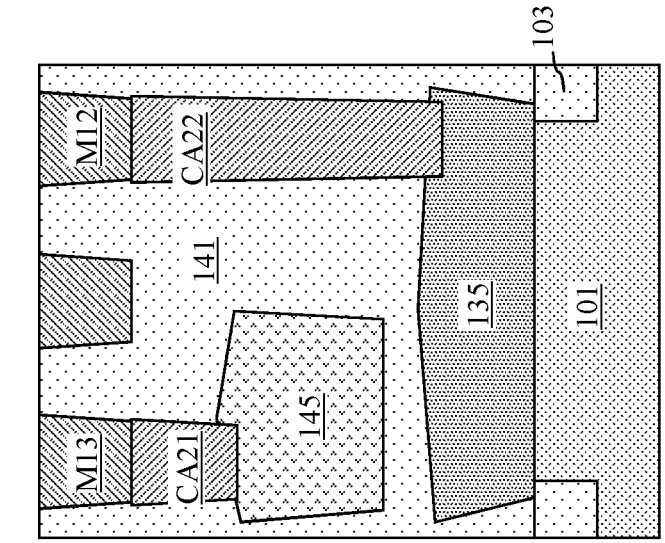
FIGS. 4A and 4B illustrate a 3D-stacked semiconductor device including a gate contact structure which is a portion of a gate structure itself, according to one or more other embodiments.
Figure 4A:
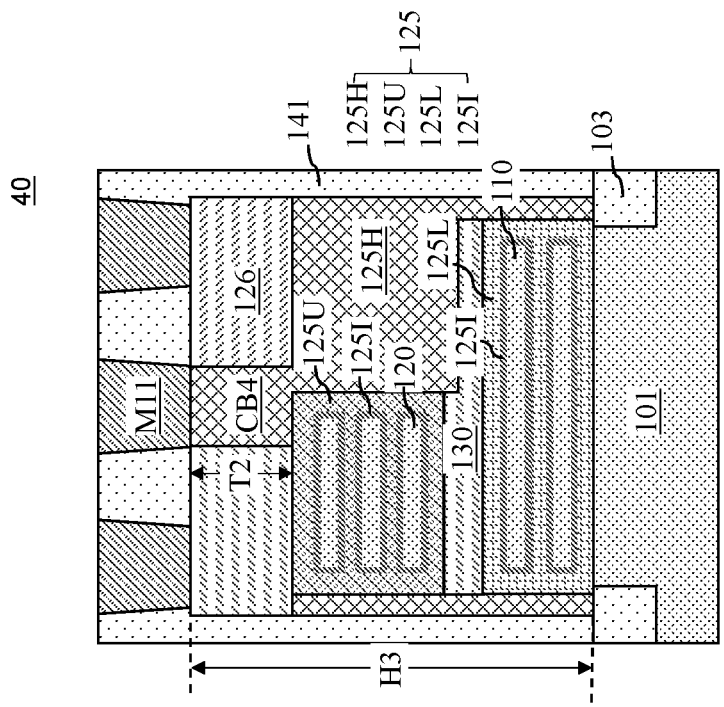

FIGS. 4A and 4B illustrate a 3D-stacked semiconductor device including a gate contact structure which is a portion of a gate structure itself, according to one or more other embodiments. FIGS. 4A and 4B are cross-section views corresponding to FIGS. 2A and 2B.

Referring to FIGS. 4A and 4B, a 3D-stacked semiconductor device 40 may have the same structural elements included in the 3D-stacked semiconductor device 20 of FIGS. 2A and 2B except that a protrusion of a gate electrode 125H, which is a gate contact structure CB4, is connected to a work-function metal layer of a gate structure 125.

As the gate structure 125 is formed such that the gate protrusion starts from a level of a top surface of the $2^{nd}$ work-function metal layer 125U, an entire height H3 of the gate structure 125 of the 3D-stacked semiconductor device 30 may become smaller than the entire height H2 of the gate structure 125 of the 3D-stacked semiconductor device 20. Further, the source/drain contact structures CA21 and CA22 may also be further shortened.

Still, however, the height-shortened gate structure 125 and source/drain contact structures CA21 and CA22 may contribute to increasing a device density and an area gain, reducing capacitance and resistance, reducing a risk of misalignment and short-circuit, and achieving a simple manufacturing process.

Provided herebelow is a method of manufacturing a 3D-stacked semiconductor device corresponding to the 3D-stacked semiconductor device 20, according to one or more embodiments.

FIGS. 5A-5B to FIGS. 13A-13B illustrate semiconductor device structures after respective steps of manufacturing a 3D-stacked semiconductor device including a gate contact structure which is a portion of a gate structure itself, according to one or more embodiments.

As the 3D-stacked semiconductor device manufactured through the respective steps shown herebelow may be the same as or may correspond to the 3D-stacked semiconductor device 20 shown in FIGS. 2A and 2B, duplicate descriptions thereof may be omitted and the same reference numbers may be used in the descriptions herebelow.

FIGS. 5A and 5B illustrate a semiconductor device structure in which a hard mask pattern is formed on a gate structure.

Referring to FIG. 5A, a semiconductor device structure 20' may include a $1^{st}$ channel layers 110, a middle isolation structure 130, and a $2^{nd}$ channel layers 120 stacked on a substrate 101 and surrounded by a gate structure 125. The gate structure 125 may be surrounded by an isolation structure 141. Further, the semiconductor device structure 20' may include a $1^{st}$ source/drain region 135 and a $2^{nd}$ source/drain region 145 respectively connected to the $1^{st}$ channel layers 110 and the $2^{nd}$ channel layers 120, and isolated from each other by the isolation structure 141.

The gate structure 125 may include a gate dielectric layer 125I, a $1^{st}$ work-function metal layer 125L, a $2^{nd}$ work-function metal layer 125U and a gate electrode 125F. The gate dielectric layer 125I may surround each of the $1^{st}$ and $2^{nd}$ channel layers 110 and 120. The $1^{st}$ work-function metal layer 125L may surround the gate dielectric layer 125I on the $1^{st}$ channel layers 110, and the $2^{nd}$ work-function metal layer 125U may surround the gate dielectric layer 125I on the $2^{nd}$ channel layers 120. The gate electrode 125F may receive a common gate input signal for a 3D-stacked semiconductor device which is to be completed based on the semiconductor device structure 20'.

As described in reference to FIGS. 1A-1C, the $2^{nd}$ channel layers 120 may have a smaller channel width than the $1^{st}$ channel layers 110, and accordingly, the $2^{nd}$ source/drain region 145 may have a smaller width than the $1^{st}$ source/drain region 135 to facilitate formation of a source/drain contact structure on a top surface of the $1^{st}$ source/drain region 135.

A hard mask pattern 151 may be formed on a top surface of a gate electrode 125F of the gate structure 125. The hard mask pattern 151 may be formed through, for example, photolithography and etching operations such that the hard mask pattern 151 is disposed on a top surfaces of the gate electrode 125F at a portion where a gate contact structure is to be formed therebelow in a later step. The hard mask pattern 151 may include a dielectric material such as silicon nitride (SiN), titanium nitride (TiN), or silicon oxynitride (SiON), not being limited thereto.

Figure 6B:
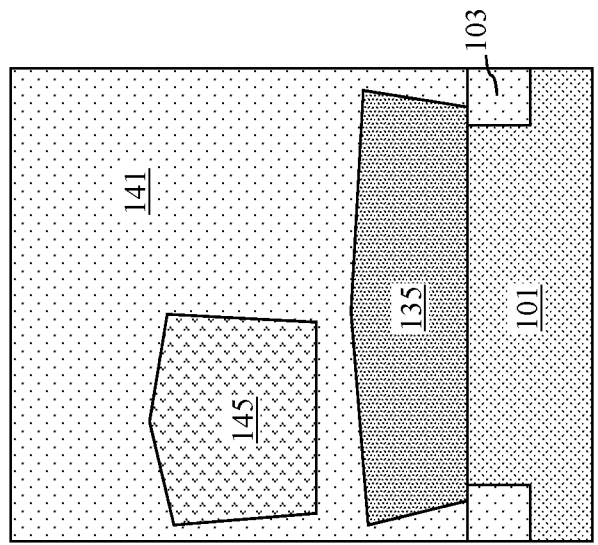
FIGS. 6A and 6B illustrate a semiconductor device structure of which a gate structure is patterned to form a gate protrusion based on a hard mask pattern.
Figure 6A:
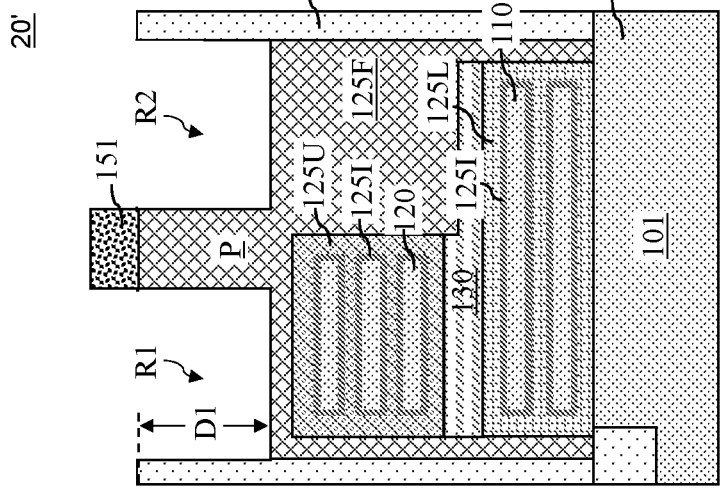

FIGS. 6A and 6B illustrate a semiconductor device structure of which a gate structure is patterned to form a gate protrusion based on a hard mask pattern.

Referring to FIG. 4A, the gate electrode 125F may be partially patterned by a depth D1 based on the hard mask pattern 151 to form two recesses R1 and R2. Thus, the gate electrode 125F may have a protrusion P below the hard mask pattern 151 between the two recesses R1 and R2. The protrusion P may be termed as such because it is protruded with respect to a top surface of the gate structure 125 above which the gate electrode 125F is partially removed.

The protrusion P of the gate electrode 125F may have a height equal to the depth D1 of the two recesses R1 and R2.

The patterning operation in this step may be performed through, for example, dry etching or wet etching selectively etching the gate electrode 125F against the hard mask pattern 151 and the isolation structure 141 surrounding the gate structure 125.

Figure 7B:
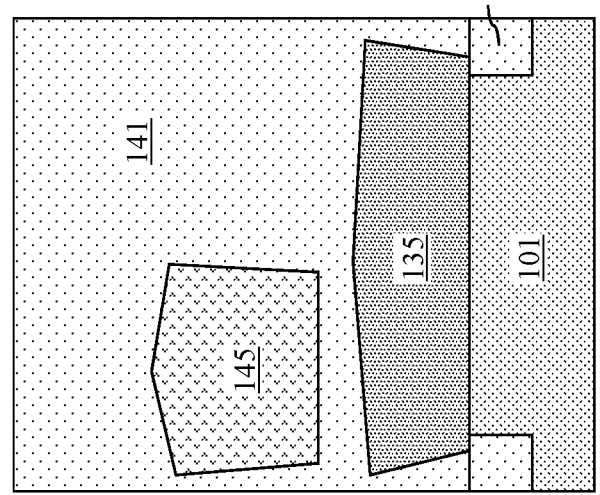
FIGS. 7A and 7B illustrate a semiconductor device structure of which a gate capping structure is filled in recesses obtained by patterning the gate structure in the previous step to surround the gate protrusion.
Figure 7A:
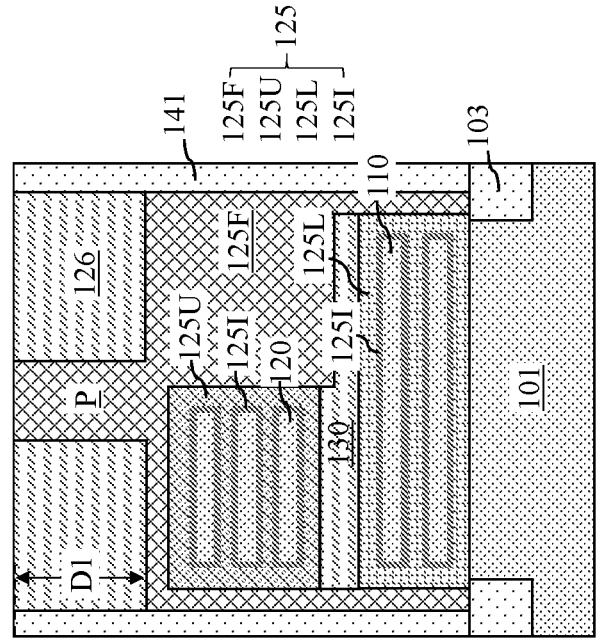

FIGS. 7A and 7B illustrate a semiconductor device structure of which a gate capping structure is filled in recesses obtained by patterning the gate structure in the previous step to surround the gate protrusion.

Referring to FIGS. 7A and 7B, a gate capping structure 126 may be formed in each of the recesses R1 and R2 by depositing silicon nitride (e.g., SiN, SiBCN, SiCN, SiOCN, etc.) through, for example, physical vapor deposition (PVD), chemical vapor deposition (CVD), plasma enhanced chemical vapor deposition (PECVD), or a combination thereof, followed by planarization such as chemical-mechanical polishing (CMP), not being limited thereto. After the formation of the gate capping structure 126 in each of the recesses R1 and R2, the protrusion P of the gate electrode 125F may be surrounded by the gate capping structures 126, and a top surface of the protrusion may be horizontally aligned or coplanar with a top surface of the gate capping structures 126.

Figure 8B:
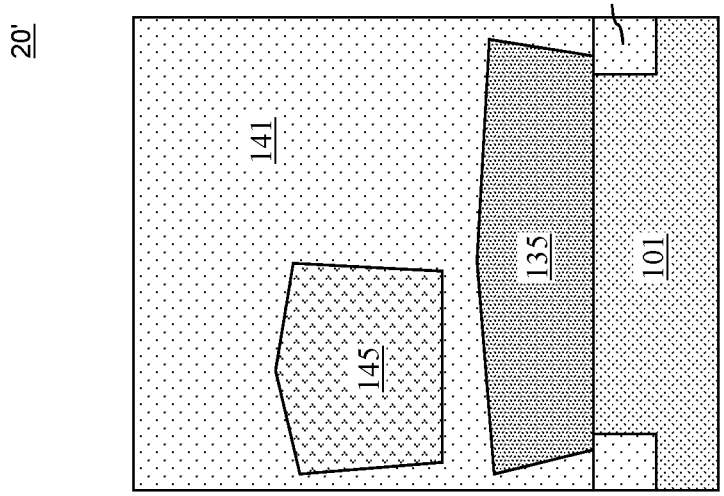
FIGS. 8A and 8B illustrate a semiconductor device structure in which a gate protrusion is partially patterned.
Figure 8A:
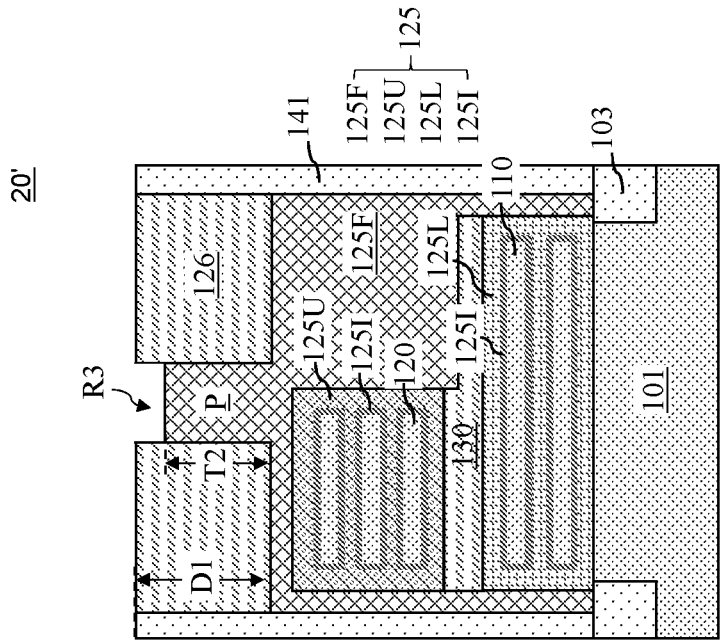

FIGS. 8A and 8B illustrate a semiconductor device structure in which a gate protrusion is partially patterned.

Referring to FIGS. 8A and 8B, the protrusion P of the gate electrode 125F may be partially etched back so that a recess R3 may be formed between the gate capping structures 126 on the etched protrusion P. The partial etching in this step may be performed through, for example, photolithography, masking, and dry and/or wet etching, not being limited thereto, such that the etched protrusion P of the gate electrode 125F may have a height T2. This height of the protrusion P of the gate electrode 126E may define a gate contact structure of a 3D-stacked semiconductor device to be formed based on the semiconductor device structure 20'.

Figure 9A:
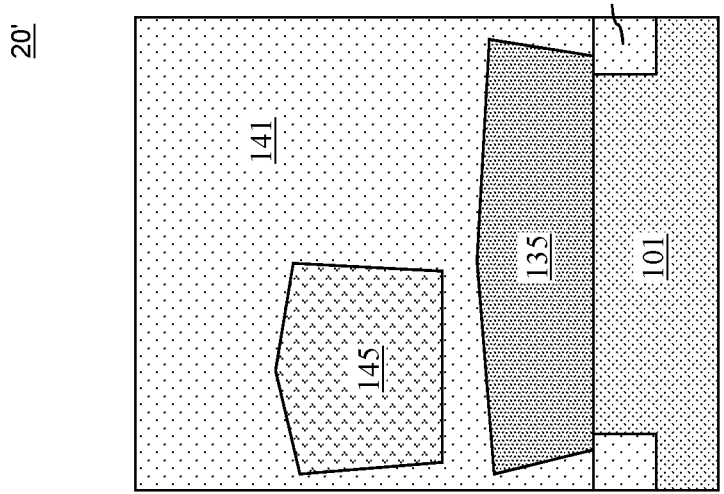
FIGS. 9A and 9B illustrate a semiconductor device structure in which a recess obtained by partial patterning of a gate protrusion is filled in with an additional gate capping structure.
Figure 9B:
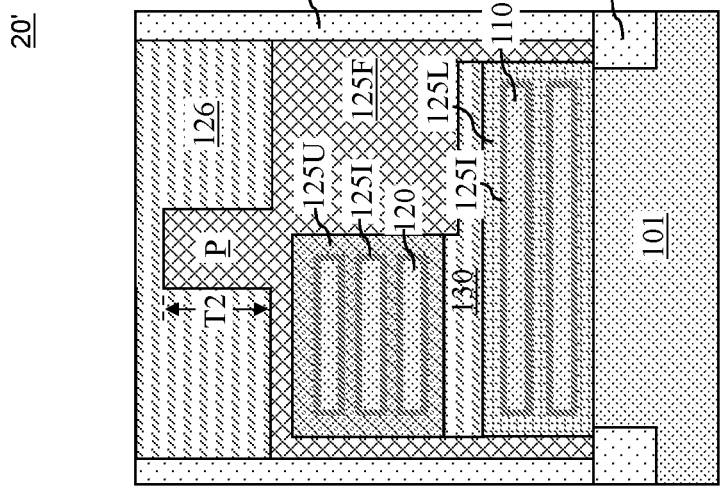

FIGS. 9A and 9B illustrate a semiconductor device structure in which a recess obtained by partial patterning of a gate protrusion is filled in with an additional gate capping structure.

Referring to FIGS. 9A and 9B, the recess R3 obtained by partial etching of the protrusion of the gate electrode 125F in the previous step may be filled in with an additional gate capping structure of silicon nitride (e.g., SiN, SiBCN, SiCN, SiOCN, etc.) through, for example, PVD, CVD, PECVD, or a combination thereof, followed by planarization such as CMP, not being limited thereto. Thus, the protrusion P of the gate electrode 125F may be entirely capped by the extended gate capping structure 126.

Figure 10B:
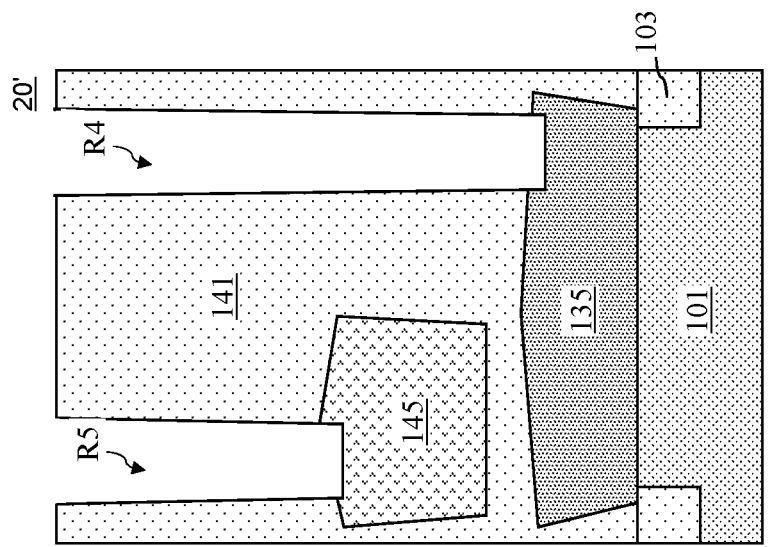
FIGS. 10A and 10B illustrate a semiconductor device structure in which an isolation structure is extended to cover an extended gate capping structure, and a top surface of each of two source/drain regions at two different levels is exposed through the extended isolation structure.
Figure 10A:
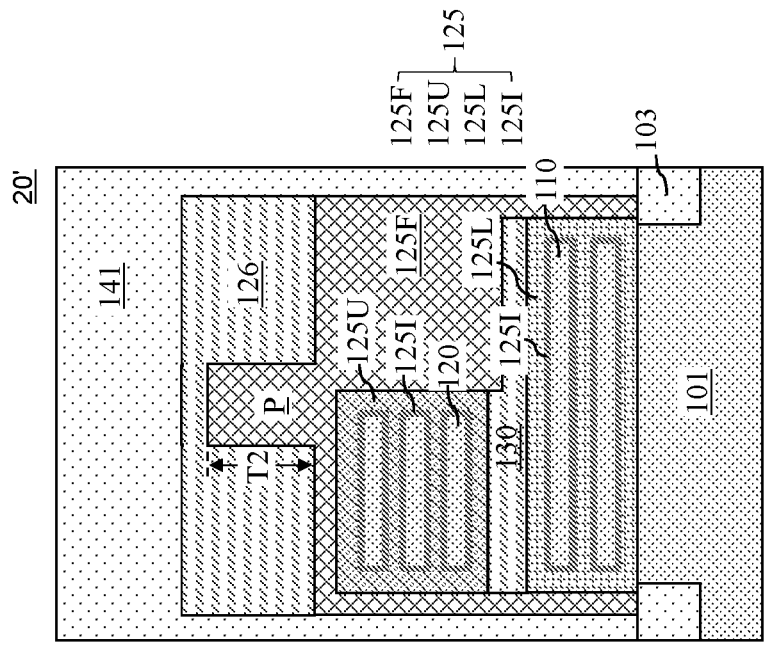

FIGS. 10A and 10B illustrate a semiconductor device structure in which an isolation structure is extended to cover an extended gate capping structure, and a top surface of each of two source/drain regions at two different levels is exposed through the extended isolation structure.

Referring to FIGS. 10A and 10B, an additional isolation structure may be formed on the existing isolation structure 141 and the extended gate capping structure 126 so that an extended isolation structure may be formed to surround the $1^{st}$ and $2^{nd}$ source/drain regions 135 and 145. The extended gate capping structure 126 may also be covered by the extended isolation structure 141. The formation of the additional isolation structure may be performed through, for example, PVD, CVD, PECVD, or a combination thereof, followed by planarization such as CMP, not being limited thereto.

Further, the extended isolation structure 141 may go through, for example, photolithography, masking, and dry and/or wet etching to form recesses R4 and R5 in the extended isolation structure 141 which exposes top surfaces of the $1^{st}$ and $2^{nd}$ source/drain regions 135 and 145, respectively.

Figure 11B:
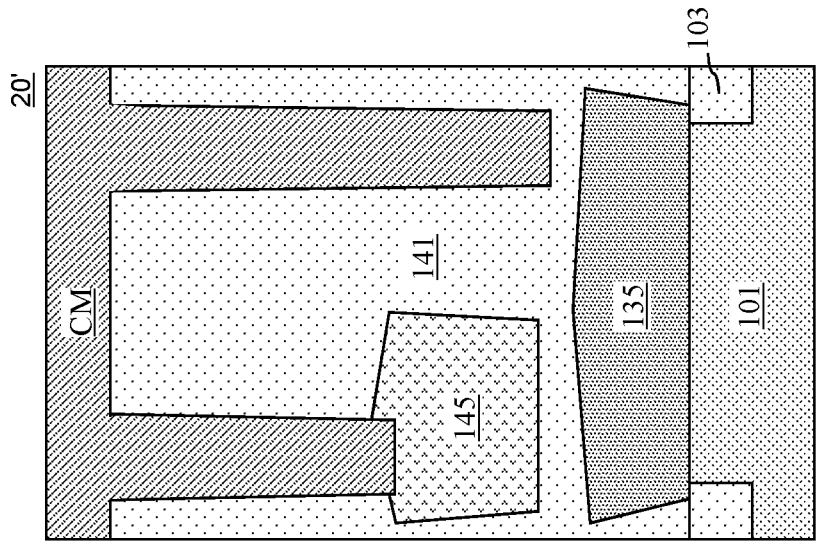
FIGS. 11A and 11B illustrate a semiconductor device structure in which a metal structure is formed to fill recesses exposing top surfaces of two source/drain regions.
Figure 11A:
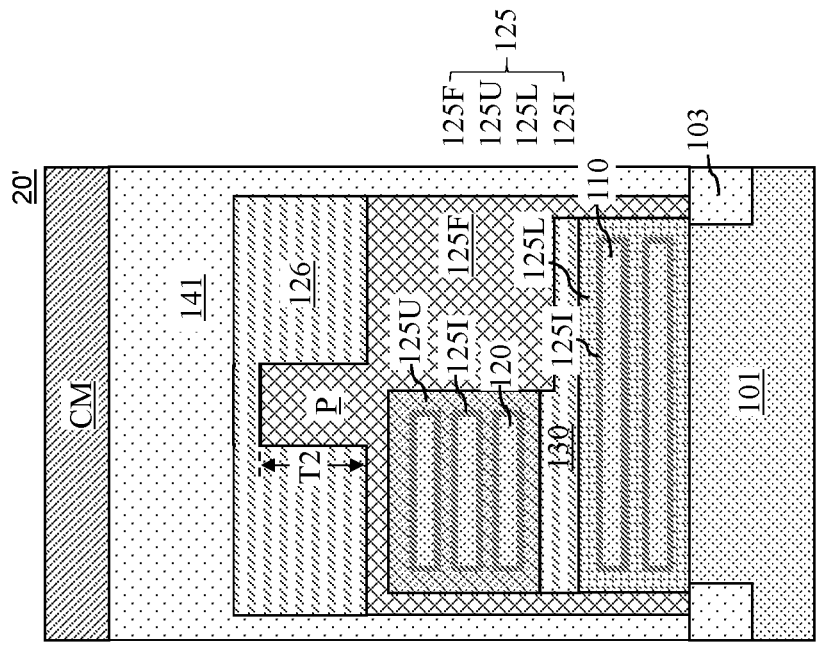

FIGS. 11A and 11B illustrate a semiconductor device structure in which a metal structure is formed to fill recesses exposing top surfaces of two source/drain regions.

Referring to FIGS. 11A and 11B, a metal or metal compound may be deposited on the semiconductor device structure 20' obtained in the previous step such that the metal or metal compound may fill in the recesses R4 and R5 to contact the top surfaces of the $1^{st}$ and $2^{nd}$ source/drain regions 135 and 145. The deposition of the metal or metal compound may be performed through, for example, PVD, CVD, PECVD, or a combination thereof, followed by planarization such as CMP, not being limited thereto.

Figure 12A:
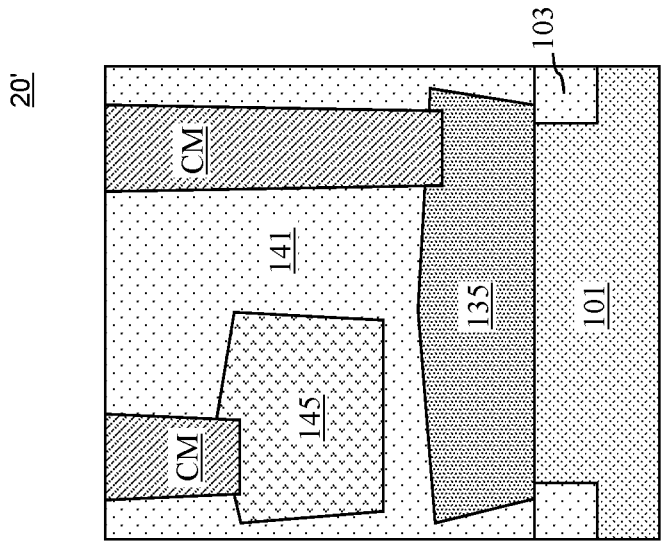
FIGS. 12A and 12B illustrate a semiconductor device structure which is patterned to expose a top surface of a gate protrusion and form source/drain contact structures.
Figure 12B:
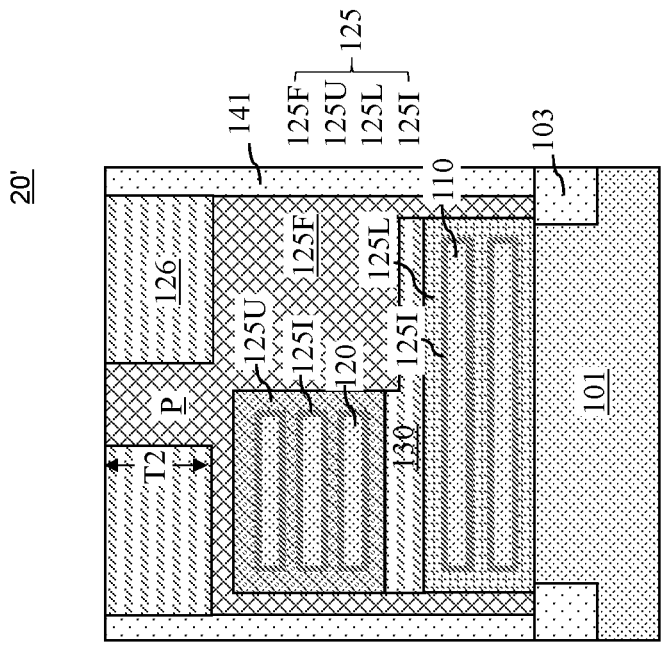

FIGS. 12A and 12B illustrate a semiconductor device structure which is patterned to expose a top surface of a gate protrusion and form source/drain contact structures.

Referring to FIGS. 12A and 12B, the metal or metal compound deposited in the previous step, the extended isolation structure 141, and the extended gate capping structure 126 may be etched back such that a top surface of the protrusion P of the gate electrode 125F is exposed, and $1^{st}$ and $2^{nd}$ source/drain contact structures CM are formed on the $1^{st}$ and $2^{nd}$ source/drain regions 135 and 145, respectively.

The etch-back operation in this step may be performed through, for example, dry etching, wet etching, ashing and/or stripping, not being limited thereto.

FIGS. 13A and 13B illustrate a semiconductor device structure on which metal lines are formed to be connected to a gate protrusion and source/drain contact structures.

Referring to FIGS. 13A and 13B, a BEOL layer including metal lines M11-M13 may be formed on the semiconductor device structure 20' obtained in the previous step such that the metal line M11 is connected to the protrusion P of the gate electrode 125F, now a gate contact structure CB2, and the metal lines M12 and M13 are respectively connected to the contact structures CM, now $1^{st}$ and $2^{nd}$ source/drain contact structures CA1 and CA2.

The formation of the BEOL layer including the metal lines M11-M13 may be performed through, for example, one or more damascene operations, not being limited thereto.

Thus, an 3D-stacked semiconductor device which is the same as or corresponding to the 3D-stacked semiconductor device 20 shown in FIGS. 2A and 2B may be manufactured. Here, as described earlier, the gate contact structure CB2 is a part of the gate electrode 125F of the gate structure 125.

Although a method of manufacturing a 3D-stacked semiconductor device corresponding to the 3D-stacked semiconductor device 20 shown in FIGS. 2A and 2B are described above, this method may also apply to manufacturing the 3D-stacked semiconductor device 30 or 40 shown in FIGS. 3A-3B and 4A-4B, respectively.

FIG. 14 illustrates a flowchart of manufacturing a semiconductor device including a gate contact structure which is a portion of a gate structure itself, according to one or more embodiments.

In step S10, a semiconductor device structure, in which a gate structure surrounds a channel structure on a substrate, is provided.

When the semiconductor device to be manufactured is a 3D-stacked semiconductor device, the channel structure may include a $1^{st}$ channel structure formed on a substrate, and a $2^{nd}$ channel structure formed above the $1^{st}$ channel structure. The gate structure may include a $1^{st}$ work-function metal layer and a $2^{nd}$ work-function metal layer surrounding the $1^{st}$ channel structure and the $2^{nd}$ channel structure, respectively. The gate structure may further include a gate electrode which surrounds the $1^{st}$ work-function metal layer and the $2^{nd}$ work-function metal layer. The gate electrode may be a common gate electrode configured to receive a common gate input signal for the 3D-stacked semiconductor device.

In step S20, the gate electrode may be partially removed from top to form a protrusion or pillar on the gate electrode.

The partial removal of the gate electrode may be performed through, for example, photolithography/masking/etching operations based on a hard mask pattern formed on a top surface of the gate electrode where a gate contact structure is to be formed. Thus, except a portion of the gate electrode below the hard mask pattern, the gate electrode may be removed by a predetermined depth.

In step S30, a gate capping structure may be formed on a space provided by the partial removal of the gate structure, and, based on the gate capping structure, a part of the protrusion may be removed from top so that the protrusion is formed as a gate contact structure of the semiconductor device structure which will receive a gate input signal for a semiconductor device to be completed from the semiconductor device structure.

In step S40, a BEOL layer may be formed on the gate contact structure, and the gate contact structure may be connected to a metal line included in the BEOL layer.

Thus, a semiconductor device manufactured based on the above-described process may dispense with a separate gate contact structure because a portion of a gate electrode is formed as a gate contact structure for the semiconductor device.

Figure 15:
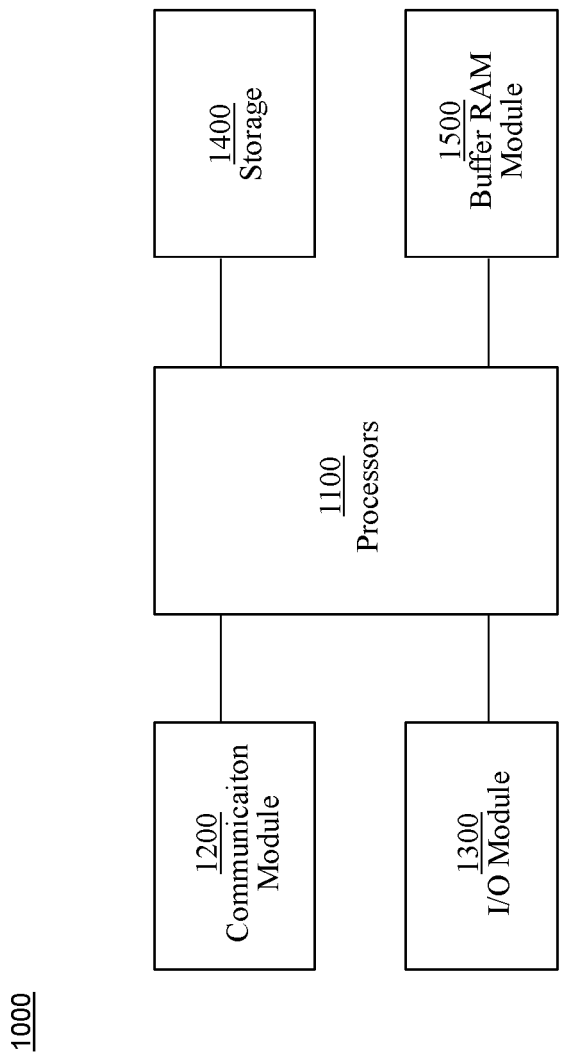
FIG. 15 is a schematic block diagram illustrating an electronic device including at least one of the 3D-stacked semiconductor devices 20, 30 and 40 shown in FIGS. 2A-2B to 4A-4B manufactured as described above in reference to FIGS. 5A-5B to 13A-13B and FIG. 14, according to one or more embodiments.

FIG. 15 is a schematic block diagram illustrating an electronic device including at least one of the 3D-stacked semiconductor devices 20, 30 and 40 shown in FIGS. 2A-2B to 4A-4B and the 3D-stacked semiconductor device manufactured as described above in reference to FIGS. 5A-5B to 13A-13B and FIG. 14, according to one or more embodiments.

Referring to FIG. 15, an electronic device 1000 may include at least one processor 1100, a communication module 1200, an input/output module 1300, a storage 1400, and a buffer random access memory (RAM) module 1500. The electronic device 1000 may be a mobile device such as a smartphone or a tablet computer, not being limited thereto, according to embodiments.

The processor 1100 may include a central processing unit (CPU), a graphic processing unit (GPU) and/or any other processors that control operations of the electronic device 1000. The communication module 1200 may be implemented to perform wireless or wire communications with an external device. The input/output module 1300 may include at least one of a touch sensor, a touch panel a key board, a mouse, a proximate sensor, a microphone, etc. to receive an input, and at least one of a display, a speaker, etc. to generate an output signal processed by the processor 1100. The storage 1400 may be implemented to store user data input through the input/output module 1300, the output signal, etc. The storage 1400 may be an embedded multimedia card (eMMC), a solid state drive (SSD), a universal flash storage (UFS) device, etc.

The buffer RAM module 1500 may temporarily store data used for processing operations of the electronic device 1000. For example, the buffer RAM 1500 may include a volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

Although not shown in FIG. 15, the electronic device 1000 may further include at least one sensor such as an image sensor.

At least one component in the electronic device 1000 may be formed based on at least one of the 3D-stacked semiconductor devices 20, 30 and 40 shown in FIGS. 2A-2B to 4A-4B and the 3D-stacked semiconductor device manufactured as described above in reference to FIGS. 5A-5B to FIGS. 13A-13B and FIG. 14, according to one or more embodiments.

In the above embodiments, each of the gate contact structures which is a portion of the gate structure itself is formed for a 3D-stacked semiconductor device. However, this gate contact structure may also be formed for a single-stack or single-level transistor, according to one or more other embodiments.

In the above embodiments, each of the 3D-stacked semiconductor devices includes a transistor at a $2^{nd}$ level having a shorter-width channel structure and a shorter-width source/drain region compared with a transistor at a $1^{st}$ level. However, each of the gate contact structures according to the above embodiments may also be formed in a semiconductor device in which a transistor at a $1^{st}$ level and a transistor at a $2^{nd}$ level have the same-width channel structures and the same-width source/drain regions.

In the above embodiments, each of the 3D-stacked semiconductor devices includes a common gate electrode for both transistors at a $1^{st}$ level and a $2^{nd}$ level although they may have different work-function metal layers. However, each of the gate contact structures according to the above embodiments may also be formed in a semiconductor device in which a transistor at a $1^{st}$ level and a transistor at a $2^{nd}$ level have separate gate electrodes isolated from each other. In this case, the gate contact structure of the above embodiments may be for the gate electrode of the transistor of the $2^{nd}$ level.

In the above embodiments, each of the 3D-stacked semiconductor devices is described as including one or more nanosheet transistors. However, each of the gate contact structures according to the above embodiments may also be formed in a semiconductor device including different types of transistor such as FinFET, forksheet transistor, etc.

The foregoing is illustrative of example embodiments and is not to be construed as limiting the disclosure. Although a few example embodiments have been described, those skilled in the art will readily appreciate that many modifications are possible in the above embodiments without materially departing from the disclosure.

What is claimed is:

1. A method of manufacturing a semiconductor device, the method comprising:
    forming a gate structure on a channel structure;
    patterning the gate structure except a portion such that the portion forms a protrusion on the patterned gate structure; and
    connecting the protrusion to a metal line,
    wherein the protrusion is a gate contact structure configured to receive a gate input signal for the semiconductor device.

2. The method of claim 1, wherein the patterning the gate structure comprises:
    forming a hard mask pattern on a top surface of the portion of the gate structure; and
    removing the gate structure from top except the portion based on the hard mask pattern.

3. The method of claim 1, wherein the patterning the gate structure comprises partially patterning the gate structure from top except the portion by a predetermined depth from top.

4. The method of claim 1, wherein the gate structure comprises a gate dielectric layer, a work-function metal layer, and a gate electrode, and
    wherein the patterning the gate structure is performed on the gate electrode among the gate dielectric layer, the work-function metal layer, and gate electrode.

5. The method of claim 1, wherein the gate structure comprises a gate dielectric layer, a work-function metal layer, and a gate electrode, and
    wherein the gate contact structure is a portion of the gate electrode.

6. The method of claim 1, further comprising forming a gate capping structure to surround the protrusion,
    wherein the gate capping structure comprises a dielectric material.

7. The method of claim 1, wherein the patterning the gate structure comprises:
    patterning the gate structure to form an initial protrusion on the patterned gate structure;
    forming a gate capping structure to surround the initial protrusion;
    removing a top portion of the initial protrusion to form the protrusion based on the gate capping structure;
    forming an additional gate capping structure on a top surface of the protrusion;
    forming an isolation structure on the gate capping structure; and
    patterning the isolation structure and the additional capping structure to expose the top surface of the protrusion.

8. The method of claim 7, further comprising:
    forming a source/drain contract structure through the isolation structure.

* * * * *